United States Patent
Barzen (10) Patent No.: US 10,469,958 B2
(45) Date of Patent: Nov. 5, 2019

(54) MEMS SOUND TRANSDUCER, MEMS MICROPHONE AND METHOD FOR PROVIDING A MEMS SOUND TRANSDUCER

(71) Applicant: Infineon Technologies AG, Neubiberg (DE)

(72) Inventor: Stefan Barzen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/915,858

(22) Filed: Mar. 8, 2018

(65) Prior Publication Data

US 2018/0262844 A1    Sep. 13, 2018

(30) Foreign Application Priority Data

Mar. 10, 2017  (DE) ........................ 10 2017 204 006

(51) Int. Cl.
| | |
|---|---|
| H04R 19/04 | (2006.01) |
| H04R 7/06 | (2006.01) |
| H04R 19/00 | (2006.01) |
| H04R 7/04 | (2006.01) |
| H04R 7/16 | (2006.01) |
| B81B 3/00 | (2006.01) |
| B81C 1/00 | (2006.01) |
| H04R 1/04 | (2006.01) |
| H04R 31/00 | (2006.01) |

(52) U.S. Cl.
CPC .......... H04R 19/04 (2013.01); B81B 3/0051 (2013.01); B81B 3/0054 (2013.01); H04R 7/04 (2013.01); H04R 7/16 (2013.01); H04R 19/005 (2013.01); *B81B 2201/0257* (2013.01); *B81B 2203/0127* (2013.01); *B81B 2203/053* (2013.01); *B81C 1/00158* (2013.01); *H04R 1/04* (2013.01); *H04R 7/06* (2013.01); *H04R 31/006* (2013.01); *H04R 2201/003* (2013.01); *H04R 2410/03* (2013.01)

(58) Field of Classification Search
CPC ... H04R 1/04; H04R 7/04; H04R 7/06; H04R 7/16; H04R 19/005; H04R 31/006; H04R 2201/003; H04R 2410/03
See application file for complete search history.

(56) References Cited

U.S. PATENT DOCUMENTS

| | | | |
|---|---|---|---|
| 6,535,460 B2 | 3/2003 | Loeppert et al. | |
| 9,148,712 B2* | 9/2015 | Dehe | .............. H04R 1/005 |
| 2007/0154040 A1 | 7/2007 | Chen | |
| 2008/0123876 A1* | 5/2008 | Sato | .............. H04R 19/016 |
| | | | 381/174 |

FOREIGN PATENT DOCUMENTS

| | | |
|---|---|---|
| DE | 102009000583 A1 | 8/2010 |
| WO | 2017189910 A1 | 11/2017 |

* cited by examiner

*Primary Examiner* — Brian Ensey
(74) *Attorney, Agent, or Firm* — Slater Matsil, LLP (57) ABSTRACT

An MEMS sound transducer comprises a first and a second backplate, as well as a diaphragm, which is arranged between the first and the second backplate and is held by an edge fastening between the first and the second backplate. The MEMS sound transducer comprises a clamping structure, which is configured to provide fixing for the diaphragm when an electrostatic force acting in an operating state is applied between the first and the second backplate and at a distance from the edge fastening, and to release the fixing in absence of the electrostatic force.

27 Claims, 6 Drawing Sheets

MEMS SOUND TRANSDUCER, MEMS MICROPHONE AND METHOD FOR PROVIDING A MEMS SOUND TRANSDUCER

This application claims the benefit of German Application No. 102017204006.8, filed on Mar. 10, 2017, which application is hereby incorporated herein by reference in its entirety.

BACKGROUND

Sound transducers, for instance microphones and/or loudspeakers, may be configured as microelectromechanical systems (MEMS). To this end, semiconductor materials may be used, which makes it possible to produce the sound transducers on the basis of a wafer. Such sound transducers may have one mobile and at least one static electrode. The mobile electrode may be configured as a diaphragm, which is deflected relative to the static electrode.

SUMMARY

Exemplary embodiments provide an MEMS sound transducer having a first and a second backplate and a diaphragm, which is arranged between the first and the second backplate and is held by an edge fastening between the first and the second backplate. The MEMS sound transducer comprises a clamping structure, which is configured to provide fixing for the diaphragm when an electrostatic force acting in an operating state is applied between the first and the second backplate and at a distance from the edge fastening, and to release the fixing in absence of the electrostatic force.

Exemplary embodiments provide an MEMS microphone having such a sound transducer.

Exemplary embodiments provide a method for providing an MEMS sound transducer. The method comprises provision of a first and a second backplate. The method comprises arrangement of a diaphragm between the first and the second backplate, so that it is held by an edge fastening between the first and the second backplate. The method comprises arrangement of a clamping structure so that it provides fixing for the diaphragm when an electrostatic force acting in an operating state is applied between the first and the second backplate and at a distance from the edge fastening, and to release the fixing in absence of the electrostatic force.

BRIEF DESCRIPTION OF THE DRAWINGS

Exemplary embodiments will be described below with reference to the appended drawings, in which:

FIG. 2b shows a schematic sectional side view of one possible embodiment of the compensation structure of FIG. 2a;

DETAILED DESCRIPTION OF ILLUSTRATIVE EMBODIMENTS

Before exemplary embodiments of the present discoveries are explained in more detail below with the aid of the drawings, it will be pointed out that elements, objects and/or structures which are identical, optionally equivalent or have the same effect, in the various figures are provided with the same references, so that the description of these elements as presented in different exemplary embodiments may be interchanged with one another or applied to one another.

Exemplary embodiments below relate to an MEMS sound transducer, to an MEMS microphone having an MEMS sound transducer and to a method for producing an MEMS sound transducer. MEMS sound transducers may be used both to generate and to sense diaphragm deflections, so that the comments below may also readily be applied to MEMS loudspeakers having an MEMS sound transducer as described.

MEMS sound transducers as described may be configured in order to interact with a fluid. The fluid may be gaseous, for instance air or another atmosphere, for example in a measurement environment. As an alternative or in addition, at least one of the sound transducers described may be configured in order to interact with a liquid fluid, for instance water or any other desired liquid. The fluid may also be an aggressive medium. To this end, the MEMS sound transducer may have suitable resistant layers which come into contact with the fluid.

In some embodiments, the temporary fixing of a diaphragm at a distance from an edge of the diaphragm makes it possible to maintain the position of the diaphragm during the fixing, and furthermore allows a movement of the diaphragm during time intervals in which the fixing is released. This movement makes it possible to reduce or avoid material stress in the diaphragm, so that a high accuracy of the diaphragm oscillation can be obtained.

Figure 1A:
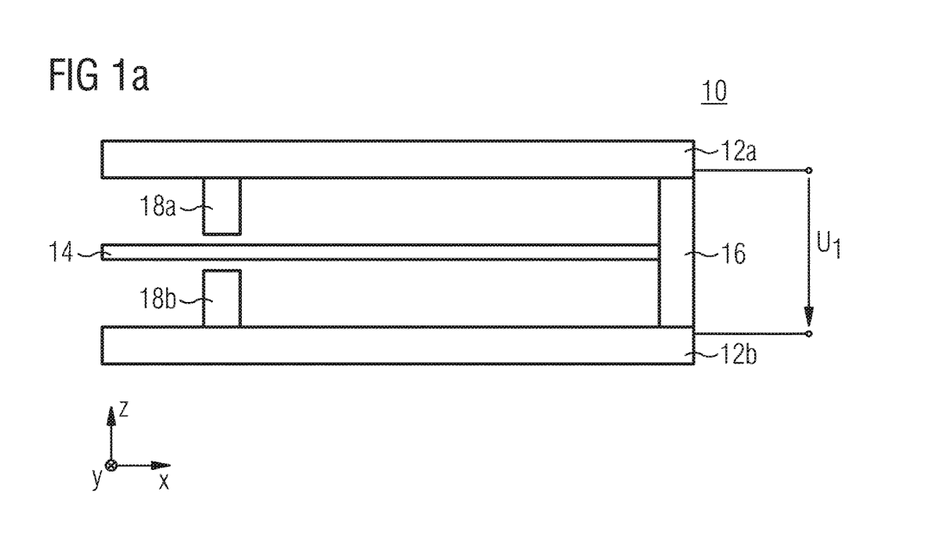
FIG. 1a shows a schematic sectional side view of an MEMS sound transducer according to one exemplary embodiment in a first operating state.

FIG. 1a shows a schematic sectional side view of an MEMS sound transducer 10 in a first, for example voltageless operating state. The MEMS sound transducer 10 comprises a first and a second backplate 12a and 12b. The MEMS sound transducer furthermore comprises a diaphragm 14, which is arranged between the backplates 12a and 12b. The diaphragm 14 is held by an edge fastening 16 between the first and the second backplate. The edge fastening 16 may be, for example, the clamping, adhesive bonding or another concept for fastening the diaphragm 14 between the backplates 12a and 12b. Here, fastening is intended to mean connection of the diaphragm 14 to neighboring structures, for instance a substrate, which, although it allows a certain movement, establishes a rough position, such as may be obtained for example by a hook and eye principle. If the diaphragm 14 is considered, for example, in such a way that it is arranged in an x/y plane and the backplates 12a and 12b are arranged along a positive and negative z direction, which may also be referred to as the thickness direction, then the edge fastening 16 may for example allow a movement of the diaphragm 14 along the positive and/or negative z direction. The edge fastening 16 may be arranged incompletely at the edge region of the diaphragm 14, i.e. there may be regions of the edge of the diaphragm 14 which are free. The edge fastening 16 may, for example, allow the diaphragm to be mobile in the x/y plane as well where the edge fastening 16 is absent.

The MEMS sound transducer 10 furthermore comprises a clamping structure, which is configured to provide fixing for the diaphragm 14 when an electrostatic force acting in an operating state of the MEMS sound transducer 10 is applied between the backplates 12a and 12b. According to one exemplary embodiment, the clamping structure may comprise two oppositely arranged clamping elements 18a and 18b, which are configured to fix the diaphragm 14 when an electrostatic force acts on the backplates 12a and 12b.

The fixing may be provided laterally at a distance from the edge fastening 16, for instance offset with respect thereto along an x and/or y direction. The fixing may be provided at a distance from the backplates 12a and 12b and/or from a plane in which the backplates are arranged at least to a large part of at least 50%, at least 70% or at least 80% of the backplate 12a or 12b. A separation from the backplate is in this case to be understood as meaning that at least one electrical insulation layer remains arranged between the backplate and the diaphragm 14. The clamping structure may be configured to release the fixing in absence of the electrostatic force.

In the operating state shown in FIG. 1a a voltage $U_1$ may be applied between the backplates 12a and 12b. The voltage $U_1$ may for example be 0 V or another low value which corresponds to an inactive state of the MEMS sound transducer 10. If the voltage between the backplates has a value different to 0 V, then an electrostatic force may be obtained between the backplates 12a and 12b, which causes movement of the backplates 12a and 12b toward one another.

Although the edge fastening 16 represented in such a way that it is connected to the backplates 12a and 12b and is arranged between the backplates 12a and 12b, the edge fastening may also be arranged at a distance from at least one of the backplates and/or arranged laterally at a distance along the x and/or y direction from the backplates. For example, the edge fastening and the backplates may be connected to one another by means of a common substrate and thus arranged contact-free directly with respect to one another.

Figure 1B:
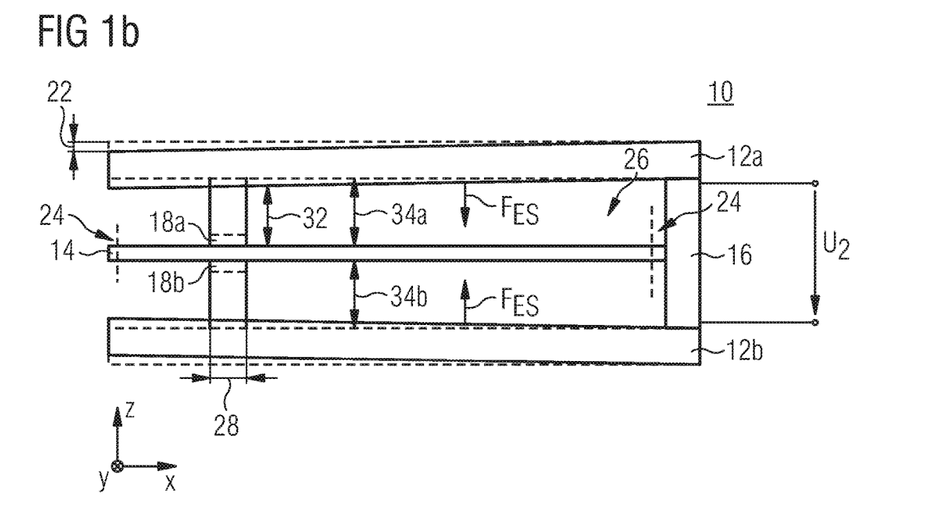
FIG. 1b shows a schematic sectional side view of the MEMS sound transducer of FIG. 1a in a second operating state.

FIG. 1b shows a schematic sectional side view of the MEMS sound transducer 10 in a second operating state, for instance in an active state or in a state ready for operation. To this end, a voltage $U_2$ may be applied between the backplates 12a and 12b. The voltage $U_2$ may for example be an operating voltage of the MEMS sound transducer, for instance 2.5 V, 3.3 V, 5 V or any other desired value. On the basis of the voltage $U_2$ between the backplates 12a and 12b, an electrostatic force $F_{ES}$ may act on the backplates 12a and/or 12b, so that a distance between the backplates 12a and 12b is reduced by a length 22 compared with the state shown in FIG. 1a. In this case, the backplates may experience a curvature, for instance when they are firmly clamped locally, for instance at an edge, and can execute the movement at other positions. The clamping structure is configured to provide fixing for the diaphragm 14, i.e. to fix the diaphragm 14. This may be understood as meaning that a freedom of movement of the diaphragm 14 along the z direction and/or in the x/y plane is restricted. This means that the diaphragm 14 is configured to oscillate along an oscillation direction during operation of the MEMS sound transducer 10, for instance the z direction. The fixing may cause a restriction of the freedom of movement of the diaphragm 14 at a distance from the edge fastening 16.

In one exemplary embodiment, the mobility of the diaphragm 14 is restricted by the fixing in such a way that no movement of the diaphragm 14 is possible. It is to be understood that, with sufficiently large application of a force to the diaphragm 14 and/or to the backplates 12a and/or 12b, a movement of the diaphragm 14 relative to at least one of the backplates 12a and 12b may be forced, even if this movement is restricted compared with absence of the fixing. For instance, with a sufficiently large pressure on the diaphragm 14 along the positive x direction, for example, a friction force between the clamping structure and the diaphragm 14 may be overcome.

The clamping structure may be configured to provide the fixing at a distance from an edge region 24 of the diaphragm 14. The edge region 24 may for example have a dimension of at most 15%, at most 10% or 5% of an outer region of a radius or distance from the geometrical midpoint of the diaphragm 14. The edge region 24 may enclose a central region 26 of the diaphragm 14, in which case the central region 26 may comprise the geometrical midpoint of the diaphragm 14.

On the basis of the electrostatic force $F_{ES}$, the backplates 12a and 12b may move toward one another so far that the backplates 12a and 12b together with the clamping elements 18a and 18b fix the diaphragm 14. As is represented for the MEMS sound transducer 10, the clamping element 18a may be mechanically connected firmly to the backplate 12a, or may be part of a common structure which comprises the backplate 12a and the clamping element 18a. In the same way, the clamping element 18b may be mechanically connected firmly to the backplate 12b, or may be part of a common structure which comprises the backplate 12b and the clamping element 18b. For example, the clamping elements may be column or post structures. For example, the clamping element 18a may be a stalactite structure and/or the clamping element 18b may be a stalagmite structure. According to further exemplary embodiments, it is possible for at least one of the clamping elements 18a and/or 18b of the clamping structure to be mechanically connected firmly to the diaphragm 14, and backplates 12a and 12b move toward the diaphragm 14 and the respective clamping element 18a or 18b when the electrostatic force $F_{ES}$ occurs.

This means that the backplates 12a and 12b, are configured to move toward one another when the electrostatic force $F_{ES}$ is applied. The clamping structure is arranged between the backplates 12a and 12b, and is configured to provide the fixing by the movement of the backplates 12a and 12b. The fixing may be released when the backplates 12a and 12b move away from one another, for instance when the voltage $U_2$ is reduced or removed, and/or a state according to FIG. 1a is set up.

As explained in detail below, at least one of the backplates 12a and/or 12b or the diaphragm 14 may have a perforation, i.e. holes in the structure. The clamping elements may be arranged on those structures of the backplates and/or of the diaphragm which have such a perforation in particular when an opposite structure does not have such perforation in the region of the clamping elements. It is thus possible to avoid the clamping element penetrating into an opening of the perforation.

Although the clamping elements 18a and 18b are represented in such a way that they are congruent in the x/y plane, the clamping elements 18a and 18b may also have a different cross section to one another in the x/y plane. As an alternative or in addition, the clamping elements 18a and 18b may also be arranged offset with respect to one another laterally, i.e. in the x/y plane. The areas, projected into the x/y plane, of the clamping elements 18a and 18b may also at least partially overlap, overlaps of at least 10%, at least 50% or at least 90% being possible in this case.

In the operating state which is represented in FIG. 1b, the oscillation behavior of the diaphragm 14, for instance a deflection, a frequency range at least of a resonant frequency, and/or another operating parameter, is influenced by the fixing of the clamping structure. This means that a frequency range, in which the diaphragm 14 can be reliably used within predetermined operating parameters, is influenced by the fixing. The MEMS sound transducer 10 may be configured in such a way that the diaphragm 14 has the diaphragm tension required for the operating frequency range during the fixing. This means that the fixing may be part of the structural layout, so that sound sensing and/or sound emission as intended is only possible by the fixing.

Along the x direction, the clamping element 18a and/or 18b may have a dimension 28. A cross section of a clamping element 18a and/or 18b, projected into the x/y plane, may have any desired geometry, for instance round, elliptical or polygonal, or also correspondingly a freeform area. The dimension 28 along the x direction and/or along the y direction they can have a value of at least 0.1 µm and at most 40 µm, at least 2 µm and at most 35 µm, or at least 5 µm and at most 30 µm. The size of the dimension 28 may, with or without taking a safety factor into account, be configured for forces which are to be transmitted to the diaphragm 14. The number of clamping elements which is used may furthermore be taken into account. As described in detail below, the clamping structure may comprise further clamping elements, which provide fixing of the diaphragm 14 at other positions in which case forces can also be transmitted onto the diaphragm 14 elsewhere. An increased number of clamping elements may lead to a smaller dimension of the respective clamping elements along the x direction and/or along the y direction.

Along the thickness direction z, each clamping element 18a and 18b may have a common, but also individual, dimension 32, which may be referred to as the length of the respective clamping element 18a or 18b. The length 32 may be a configuration parameter such that a distance which the respective backplate 12a or 12b travels toward the diaphragm 14 and/or toward the opposite backplate 12b or 12a, respectively, is taken into account, and/or such that a force to be applied to the diaphragm 14 is taken into account. For example, in the state represented in FIG. 1a, which is likewise represented in the form of dashed lines in FIG. 1b, a distance 34a between the backplate 12a and the diaphragm 14 and/or a distance 34b between the backplate 12b and the diaphragm 14 may have a first value, for instance in a range of at least 0.5 µm and at most 20 µm, at least 1 µm and at most 15 µm, or at least 5 µm and at most 10 µm. A dimension of a gap, represented in FIG. 1a, between the clamping elements 18a and 18b and the diaphragm 14 along the z direction may, for example, have a value in a range of from 0.01 to 5 µm, in a range of at least 0.05 µm and at most 4 µm, or in a range of at least 1 µm and at most 2 µm, in which case the backplates 12a and 12b may be configured to move toward one another along the z direction at least so far that the gap is closed. This means that the dimension 32 of the clamping elements may be configured in such a way that the movement of the backplates 12a and 12b toward the diaphragm 14 is sufficient to close a gap between the clamping elements 18a and 18b and the diaphragm 14.

The configuration of an MEMS sound transducer as described in connection with FIG. 1a and FIG. 1b makes it possible to configure the diaphragm 14 at edge regions with sometimes large dimensions without clamping. It furthermore makes it possible to configure diaphragms with a relatively large thickness, i.e. with a dimension along the z direction in a range of at least 800 nm and at most 5 µm, at least 900 nm and at most 3 µm, or in a range of at least 1 µm and at most 2 µm. This makes it possible for a sensitivity of the diaphragm to be dominated by a flexural stiffness of the diaphragm 14. This may, for example, be compared with the behavior of a board or rigid beam, which is capable of oscillating even without complete circumferential clamping. In contrast thereto, many known diaphragms are configured in such a way that their sensitivity is stress-dominated. For example, these diaphragms are clamped in a similar way to a drumhead at least to a large extent along their edge region. The effect of this, however, is that, a modification of the oscillation behavior of the diaphragm is obtained on the basis of asymmetries in the clamping. This may be at least reduced by the configuration described above.

The sound transducer 10 may be configured as a dual backplate microphone with capacitive silicon or be comprised by an MEMS microphone. In general, dual backplate microphones are configured with a diaphragm and two backplates which are separated from one another by an air gap. For many concepts, the diaphragm is loaded and produced with tensile stress in order to compensate for the attractive electrostatic force between the diaphragm and the backplates. In order to obtain a high sensitivity and a large signal-to-noise ratio (SNR), the diaphragm is configured and operated in such a way that a low stress is obtained at the end of the process. Additional stress due to the manufacturing process, due to thermal expansion of different materials of the package and ageing of materials of the package inevitably introduce additional stress into a supporting structure, and therefore into the diaphragm and the backplates. This additional stress, or additional tension, may in known microphones modify the conformity of the diaphragm and/or may modify the sensitivity of the diaphragm or other acoustic parameters of the microphone. This may lead to significant loss of yield during the wafer test. In a module test, it may even lead to failure relative to customer parameters. The stress-defined diaphragm is exposed to high stress concentrations during a fall or during a pressure event, particularly at positions where it is clamped.

The MEMS sound transducer 10 makes it possible that a lateral movement of the diaphragm 14 can take place, for instance in the x/y plane, in the state according to FIG. 1a. By this movement, material stress in the diaphragm may be reduced or compensated for, that is to say the diaphragm may relax or destress. This movement makes it possible to reduce or avoid material stress in the diaphragm, so that a high accuracy of the diaphragm oscillation can be obtained.

The diaphragm 14 may therefore have a small pretension, which can lead to slight problems during operation of the diaphragm. In the state according to FIG. 1b, the diaphragm can be fixed, which may mean a high quality of generated or received sound waves during operation. A movement or displacement of the diaphragm 14, having taken place despite the fixing, beyond the holding forces of the fixing, may be reduced again or reset during a temporary state of the MEMS sound transducer 10 according to FIG. 1a.

In order to be able to reduce these risks, known MEMS and systems are configured in such a way that they have a high safety margin, but the full acoustic potential in relation to SNR and/or size and cost cannot be exploited. Bending of the diaphragm and of the backplates furthermore leads to a modification of the distance between the elements. The performance of the microphone may vary significantly. Because of this effect, large safety margins are likewise necessary, a loss of yield is accepted and the full acoustic performance may be impossible to achieve. Furthermore, expensive calibration is often necessary for the associated control chips (Application specific integrated circuit (ASIC)). The tension on the diaphragm and on the supporting structure furthermore depends on the temperature, and results in a variable acoustic sensitivity.

Described exemplary embodiments allow a diaphragm, which is vertically clamped, i.e. fixed, between the backplates. By avoiding rigid connections between the diaphragm and the backplate posts (clamping elements), the tension in the diaphragm can be reduced or destressed during production, in order to obtain an essentially stress-free position or an essentially stress-free state of the diaphragm. The conformity of the diaphragm is therefore at most insubstantially defined by the intrinsic layer tension of the diaphragm and/or influenced by external forces. The conformity of the diaphragm may therefore be determined or dominated by its own flexural stiffness. This is a very stable parameter in comparison with the other parameters, which allows a high quality of the MEMS sound transducer.

The backplate layers and the configuration of the MEMS sound transducer may be defined in such a way that the backplates move toward the diaphragm when a voltage is applied. Compared with standard microphones, higher voltages can be applied. This leads to a signal with a higher signal amplitude, which likewise allows a high quality of the signal processing. The gap between the diaphragm and the backplates may be at least partially defined by the clamping elements (posts), and may at most depend partially on bending of the diaphragm and of the backplates, or even be independent thereof. The backplates may be configured with thin layers and have a high acoustic transparency, for instance by implementing a perforation that allows soundwaves to pass through. This leads to a low contribution to noise and leads to a high SNR.

The movement of the diaphragm is free between the clamping elements. If a particle penetrates, it may locally modify the conformity, although the change in the overall sensitivity is limited.

The clamping structure may, however, also be used for diaphragms which have a sensitivity that is stress-dominated. This means that hybrid solutions may be proposed between the clamped diaphragm and the standard stress-defined diaphragm. This means that it is possible to obtain a diaphragm which has low tension, is furthermore partially fastened to the carrying structure, but is also clamped between the backplates.

Figure 2A:
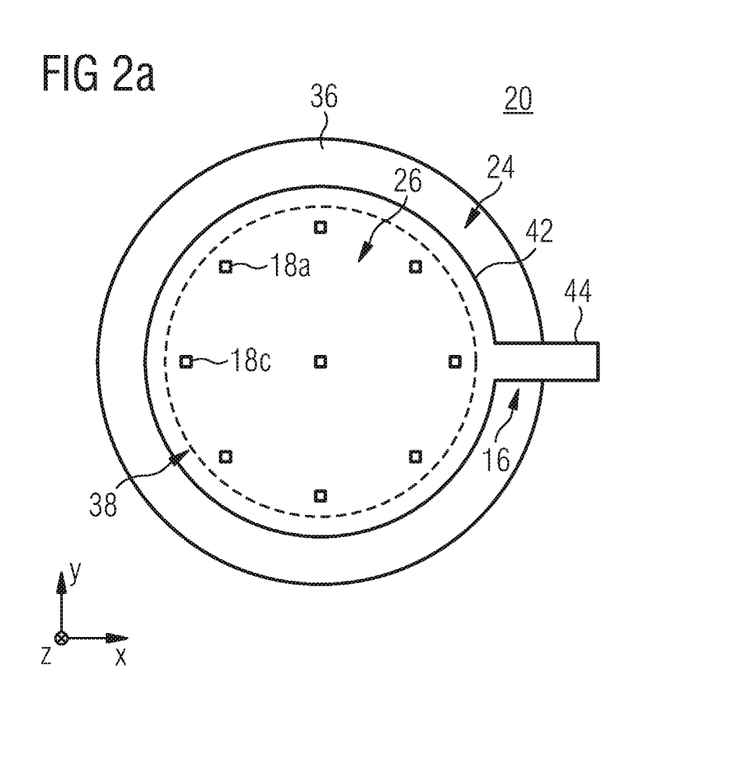
FIG. 2a shows a schematic top view of an MEMS sound transducer according to a further exemplary embodiment, which comprises a compensation structure.

FIG. 2a shows a schematic top view of an MEMS sound transducer 20 according to one exemplary embodiment. The MEMS sound transducer 20 may be configured in essentially the same way as the MEMS sound transducer 10. For example, however, a diaphragm 36 of the MEMS sound transducer 10 is stress-based. For example, the diaphragm 36 may have a dimension along the z direction in a range of from 280 nm to 660 nm, i.e. it may be configured to be thin compared with the diaphragm 14. A clamping structure 38 may comprise a plurality or multiplicity of clamping elements 18a to 18c. Nine clamping elements 18a to 18c are represented, for instance on an upper side of the diaphragm 36. Further clamping elements may respectively be arranged on the opposite side to the clamping elements represented, for instance, a lower side of the diaphragm 36 so that the clamping structure comprises a plurality or multiplicity of opposing pairs of clamping elements. The terms upper side and lower side refer to an arrangement along the z direction, and are to be understood by way of explanation but not restrictively. It is to be understood that any other desired nomenclature is valid after rotation of the MEMS sound transducer 20 in space as desired.

The MEMS sound transducer 20 may comprise a compensation structure 42, which makes it possible to decouple the central region 26 from the edge region 24 at least partially in terms of material stress. This means that the central region 26 can have a low material stress compared with the edge region 24. This may also be understood as meaning that the central region 26 is mobile or displaceable in the x/y plane in the absence of the fixing of the clamping structure 38.

A connection 44 may be formed in order to connect at least the central region 26 of the diaphragm 36 to an electrical contact. The connection 44 may at the same time provide the edge fastening 16.

The compensation structure 42 may be configured in any desired way in order to at least partially reduce stress, which is induced in the edge region 24, relative to the central region 26, or vice versa.

Figure 2B:
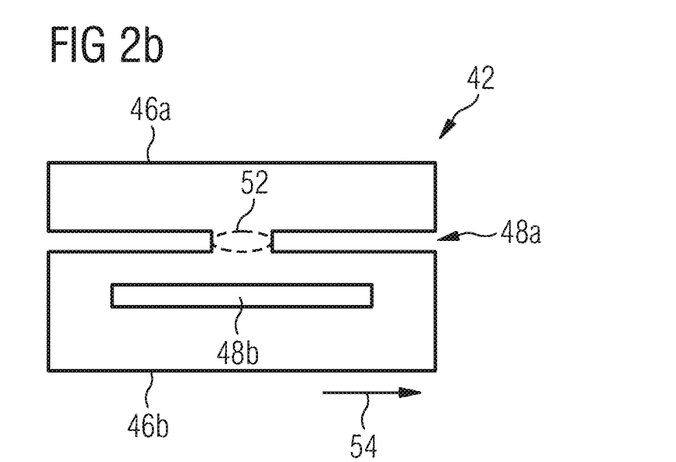

FIG. 2b shows a schematic sectional side view of one possible embodiment of the compensation structure 42, which is formed as a doubly configured spring. The compensation structure 42 has two regions 46a and 46b, of which one is for example connected to the edge region 24 and the other to the central region 26. A plurality of spring elements or spring regions 48a and 48b may be arranged between the regions 46a and 46b, for instance in the form of openings in a diaphragm material, in order to obtain flexibility of the remaining material relative to other regions. This means that FIG. 2b schematically shows the configuration of the compensation structure 42 as a solid-state articulation.

The shown view of FIG. 2b may be understood as meaning that it is represented in the x/y plane. It is possible that the line, represented in FIG. 2a, of the compensation structure 42 is a circumferential slot or circumferential opening, which is interrupted at a plurality of regions by connecting portions represented in FIG. 2b. As an alternative, it is likewise conceivable that FIG. 2b shows the compensation structure 42 in a perspective which extends in a direction 54 in FIG. 2b parallel to the z direction in FIG. 2a. This means that the diaphragm 36 may be thinned along the compensation structure 42 and/or may have a concealed cavity (region 48b).

Referring to FIG. 2a, the compensation structure 42 may also be referred to as a spring element. The edge region 24 may, for example, be firmly connected to a substrate of the MEMS sound transducer 20. This means that the diaphragm 36 is connected at least locally (central region 26) to the substrate. An oscillation property of the diaphragm 36 may remain essentially uninfluenced by the spring element 42. This may mean that a frequency shift of resonant frequencies, which is caused by the fixing, is at most 15%, at most 10% or at most 5% compared with a state in absence of the fixing. In the scope of the configuration of the device, provision may however also be made to implement a higher frequency shift, for instance in a range of up to 50% and for reasons of robustness.

According to one embodiment, the spring element of the compensation structure 42 is configured as a solid-state articulation. According to one embodiment, the spring element and the diaphragm 36 are in this case formed in one piece, as shown for example in FIG. 2b.

A production process of an MEMS sound transducer will be described below with the aid of the following FIGS. 3a to 3g.

Figure 3A:
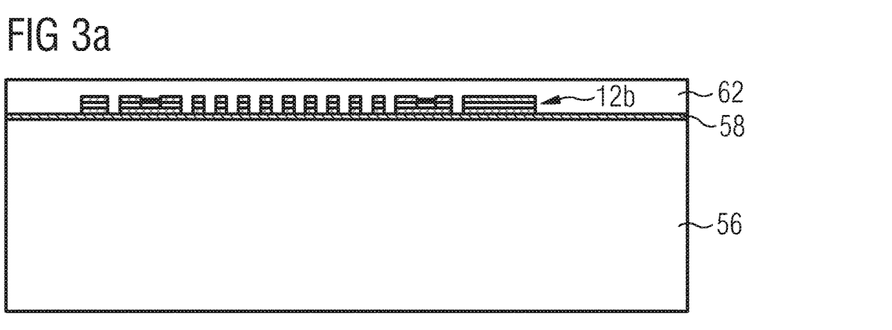
FIG. 3a shows a schematic sectional side view of a layer stack comprising a substrate, an insulation layer and a sacrificial layer, according to one exemplary embodiment.

FIG. 3a shows a schematic sectional side view of a layer stack comprising a substrate 56, an insulation layer 58 and a sacrificial layer 62, which are arranged on one another in the order stated. The substrate 56 may be a doped or undoped semiconductor material, for instance a crystalline or polycrystalline silicon material. The insulation layer 58 may for example comprise an electrically insulating material, for instance silicon oxide, silicon dioxide and/or silicon nitride. The sacrificial layer may comprise any desired material that can be removed easily with a subsequent step. For example, a chemical or physical etching process may be used. The material may, for example, comprise or be formed from a semiconductor material, such as a silicon material. The backplate 12b may already be introduced or embedded in the sacrificial layer 62. For example, the structure of the backplate 12b may be produced first and a material of the sacrificial layer 62 may be subsequently arranged, for instance a semiconductor material, for example silicon. The backplate 12b may have at least one conductive layer. The conductive layer may comprise a conductive material, for instance doped silicon or polysilicon. The conductive layer may be covered on one, several or all sides by an electrically insulating layer, in order to allow electrical insulation from an environment of the backplate 12b. Oxide materials, for instance silicon oxide, nitride materials, for instance silicon nitride, but also undoped semiconductor materials or carbon, separately or in combination with a semiconductor material, may be suitable for this.

In other words, FIG. 3a shows the lower backplate with segmentation after a CMP step (CMP=chemical-mechanical polishing).

Figure 3B:
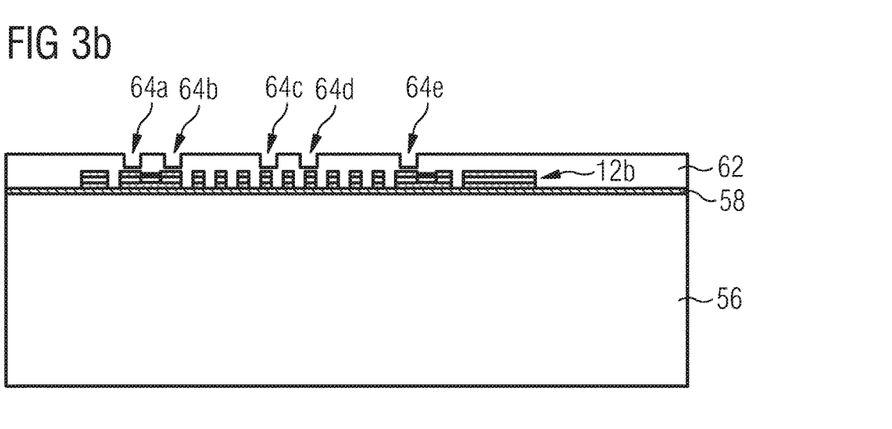
FIG. 3b shows a schematic sectional side view of the layer stack of FIG. 3a, in which recesses are introduced on a side of the sacrificial layer facing away from the substrate, according to one exemplary embodiment.

FIG. 3b shows a schematic sectional side view of the layer stack of FIG. 3a, in which recesses 64a to 64e have been introduced on a side of the sacrificial layer 62 facing away from the substrate 56, for instance by selective etching or mechanical removal. The recesses 64a to 64e may be used in a subsequent step in order to form structures, for instance anti-sticking bumps.

Figure 3C:
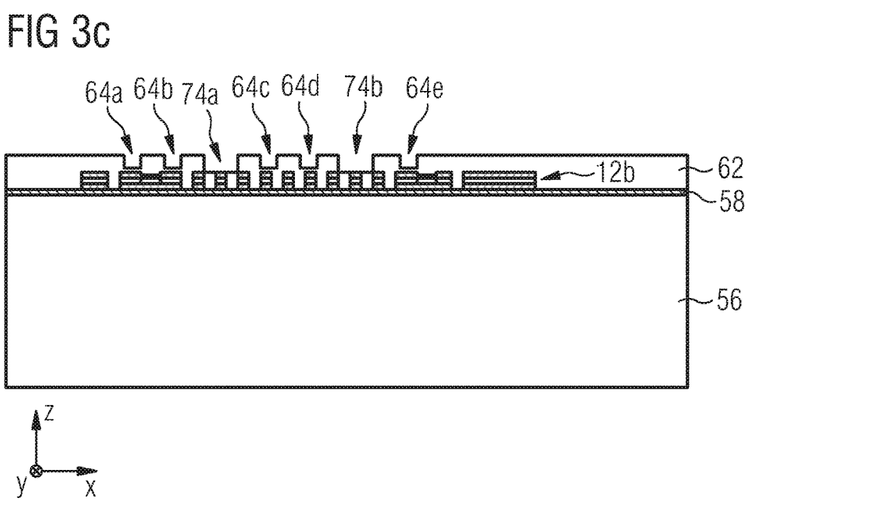
FIG. 3c shows a schematic sectional side view of the layer stack of FIG. 3b, having additional recesses for clamping elements according to one exemplary embodiment.

FIG. 3c shows a schematic sectional side view of a layer stack of FIG. 3b, which may furthermore comprise recesses 74a and 74b. Although only two recesses 74a and 74b are represented, the layer stack may comprise any desired number of such recesses, for instance at least one, at least two, at least five or more. The recesses 74a and 74b may be obtained in a similar way as the recesses 64a to 64e and be introduced into the material of the sacrificial layer 62, for instance by an etching, grinding or boring process. The recesses 74a and/or 74b may be shaped in the same way or differently to one another, and be configured to be deeper and/or wider in comparison with the recesses 64a to 64e, i.e. a dimension along one, two or three spatial directions x, y and/or z may be larger in comparison with the recesses 64a to 64e. For example, the recesses 74a and/or 74b may extend as far as the backplate 12b. The recesses 74a and 74b may be usable for the formation of the clamping elements (posts).

Although the formations of the recesses 64a and 64e and of the recesses 74a and 74b it is described in such a way that they take place in succession, the recesses may also be obtained simultaneously during one method step, for instance by adapting etch stop layers and/or etching masks.

Figure 3D:
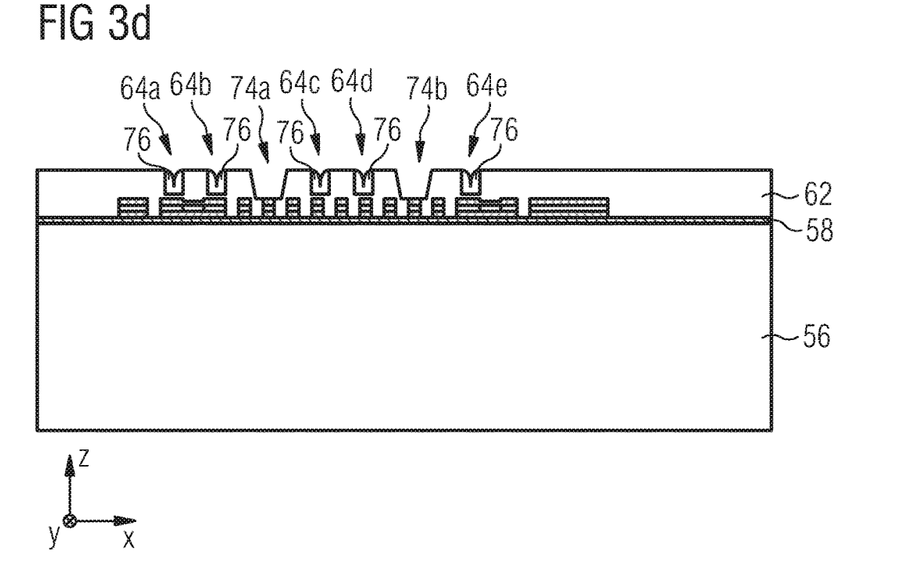
FIG. 3d shows a schematic sectional side view of the layer stack of FIG. 3c, in which the additional recesses are modified in their shape, according to one exemplary embodiment.

FIG. 3d shows a schematic sectional side view of the layer stack of FIG. 3c, in which additional material 76 is introduced into the recesses 64a to 64e. A shape of one, many or all recesses may be modified, if that should be necessary. For example, it may be possible to carry out a further etching or grinding process. The additional material may be usable in order to fulfill a shaping function for a further material, for instance in order to form structures such as anti-sticking bumps. The material 76 may be a material which is easy to remove by an etching or grinding process, for instance similar to or the same as the sacrificial layer 62, for example silicon, silicon oxide or the like. The shaping additional material may therefore be a sacrificial material, which has good solubility during an etching process. The diaphragm 14, or alternatively the diaphragm 36, may be deposited on the sacrificial layer 62. By shaping in the recesses 64a to 64e, anti-sticking bumps may be formed as part of the diaphragm 14, in order subsequently to avoid adhesion or sticking of the diaphragm 14 on the backplate 12b during operation. As an alternative or in addition, clamping elements may be formed in the recesses 74a and 74b. The formation of anti-sticking bumps illustrates one possible configurational form. Other structures may also be combined with the diaphragm, or alternatively no structures may be formed in the recesses 64a to 64e, which means that formation of the recesses 64 may also be omitted.

An arrangement of the recesses for the anti-sticking bumps and/or for the clamping elements may be varied in any desired way, and/or a combination thereof may be adapted in any desired way. A sequence of etching steps, filling steps or the like may also be varied in any desired way. For example, it is possible to modify a shape of the recesses 74a and/or 74b, for instance to enlarge them along the z direction continuously or discontinuously along the x direction and/or they direction. It is likewise possible to use the effect that the height of the anti-sticking bumps may be adapted with different etching widths. If this is used, the two etching steps for the recesses 64 and the recesses 74 may be combined in one process step.

In the recesses 74a and/or 74b, a material which is used for the clamping elements may be introduced or arranged. This may be a stable material, which can transmit the electrostatic attraction forces to the diaphragm without thereby suffering relevant damage. Inter alia oxide materials, for instance SiO or $SiO_2$, silicon or polysilicon, nitride layers, for instance SiN, and carbon materials, which may be arranged in the recesses, have been found to be suitable for this. Instead of silicon, any other desired semiconductor material may also be arranged.

Figure 3E:
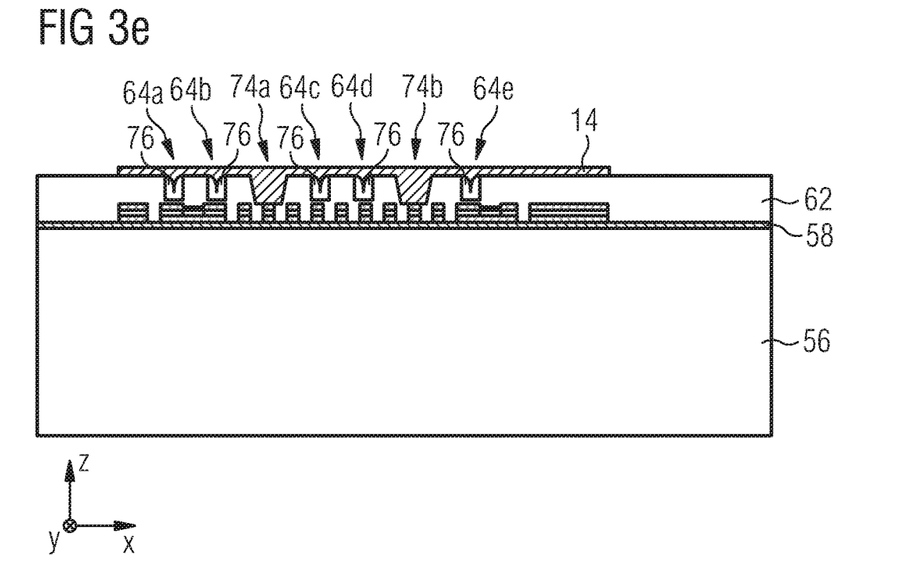
FIG. 3e shows a schematic sectional side view of the layer stack of FIG. 3d, in which a diaphragm, anti-sticking bumps and clamping elements are arranged on the sacrificial layer, according to one exemplary embodiment.

FIG. 3e shows a schematic view of the layer stack of FIG. 3c, in which the diaphragm 14 is deposited. At the same time, spaces in the recesses 64a to 64h and 74a to 74b are filled in order to obtain anti-sticking bumps and clamping elements. For the gap between the diaphragm 14 and the backplate 12b, anti-sticking bumps may be arranged on the diaphragm in order to form downward-pointing, i.e. stalactitic, anti-sticking bumps. The clamping elements may likewise be formed stalactitically.

In the representation of FIG. 3e, the diaphragm 14 may be deposited on the layer 62, so that the diaphragm 14 at the same time comprises the anti-sticking bumps and the clamping elements. A material of the clamping elements may be or comprise any desired material, in which case a diaphragm material may also be envisioned. This means that the clamping elements formed may comprise a semiconductor material, for instance silicon, germanium or the like.

Figure 3F:
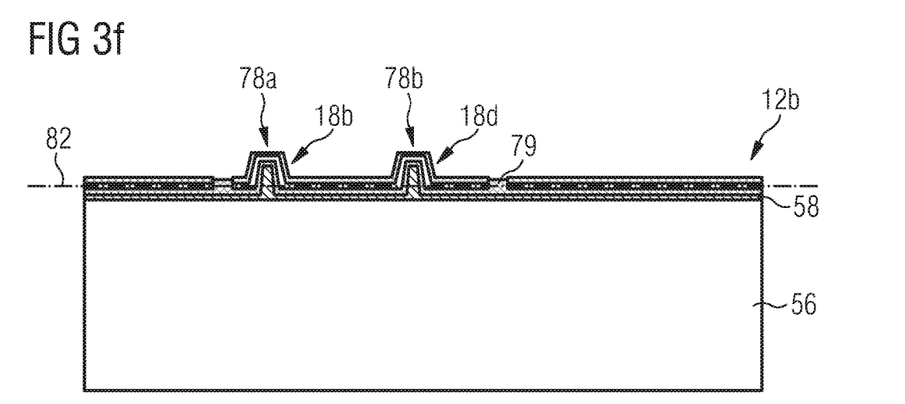
FIG. 3f shows an alternative possibility to FIG. 3e of shaping clamping elements, according to one exemplary embodiment.

FIG. 3f shows an alternative possibility to FIG. 3e for forming clamping elements 18a and 18d. They may be obtained by means of a layer 58 which is structured, i.e. partially comprises elevations 78a and/or 78b, by depositing the backplate 12b onto this nonplanar layer 58 so that the clamping elements 18b and 18d are raised from a plane 82 of the backplate 12b and distanced from this plane 82. This means that, although the clamping elements are parts of the backplate structure, they nevertheless arise from the plane 82 in which a large part or a predominant part, i.e. at least 50%, at least 70% or at least 80% of the backplate is arranged. The clamping elements may also be referred to as distanced from the principality extent plane 82 of the backplate 12b.

Clamping elements arranged on the backplate 12b may have standing, i.e. stalagmitic, shapes and point in the direction of the diaphragm. If the layer stack according to FIG. 3f is for example considered, and it is assumed that the diaphragm 14 illustrated there comprises clamping elements, then it would theoretically be possible, with small dimensions of the clamping elements, for them to penetrate into the perforation of the backplate 12b. This may be avoided for instance by using larger dimensions of the clamping elements, as is indicated by the recesses 74a and 74b in FIG. 3c and FIG. 3d. As an alternative or in addition, the stalagmitic shapes may be used, i.e. the clamping elements may already be arranged on the backplate 12b or firmly connected thereto. The standing structures may be defined in underlying layers or form a common structure with the backplate and/or be an additional layer.

Integration of the clamping elements into the backplate structures makes it possible that the clamping elements may comprise electrode structures and simultaneously be configured to be electrically insulated from other external structures, i.e. they may be covered by at least one electrically insulating layer 79, for instance comprising silicon oxide, silicon dioxide or silicon nitride. This makes it possible to avoid a short circuit when mechanical contact is established with the diaphragm 14 and/or a backplate.

The elevations 78a and 78b represented, which may subsequently be used as clamping elements, may be configurable in the same way for the backplate 12a as well, so that the two clamping elements are respectively part of the respective backplate.

The clamping elements (posts) between the diaphragm and the backplates may have a significantly greater length (dimension in the z direction) compared with the anti-sticking bumps, and may have a carefully defined height along the z direction. This may be carried out by additional steps, for instance lithographic steps and/or etching steps, in which case an identical technological procedure and/or a technological principle may be used without modification.

Figure 4:
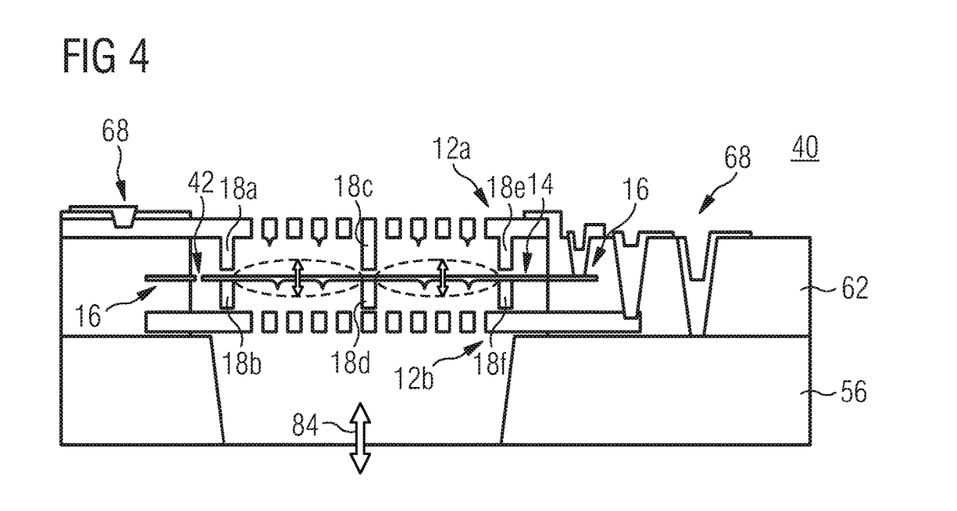
FIG. 4 shows a schematic sectional side view of an MEMS sound transducer according to one exemplary embodiment, which may be obtained starting from the layer stack according to FIG. 3e.

FIG. 4 shows a schematic sectional side view of an MEMS sound transducer 40, which may for example be obtained on the basis of the layer stack according to FIG. 3e. To this end, further steps may be used, i.e. the clamping structures may also be arranged on the backplate 12a.

Furthermore, the substrate 56, insulation layer 58 and/or sacrificial layer 62 may be removed in an acoustically active region of the MEMS sound transducer 40, for instance by backside removal, in order to expose a backside region of the MEMS sound transducer. This means that layers are removed in a region in which the diaphragm 14 is intended to be capable of oscillation, in order to allow deflection of the diaphragm 14 relative to the backplates 12a and 12b.

Furthermore, circuit structures 68 for contacting the backplates 12a and 12b and the diaphragm 14 and/or the substrate 56 may be introduced. Clamping elements 18a, 18c and 18e may be mechanically connected firmly to the backplate 12a or arranged thereon, for instance as described in connection with FIG. 3f. The MEMS sound transducer 40 may be formed in such a way that the clamping elements 18b, 18d and 18f arranged opposite the clamping elements 18a, 18c and 18e are mechanically connected firmly to the diaphragm. Here again, an embodiment according to FIG. 3f may be implemented, although other possibilities of the arrangement may also be envisioned, for example that the electrodes extend only in the plane of the diaphragm 14. The MEMS sound transducer 40 may furthermore comprise the structure 42 for relieving the load of the diaphragm 14.

As is represented by an arrow 84, a sound field can pass through at least one of the backplates 12a and 12b in order to deflect the diaphragm 14.

The clamping elements 18a and 18b, the clamping elements 18c and 18d and the clamping elements 18e and 18f respectively form a pair of opposite clamping elements of the clamping structure. The clamping elements 18a to 18f are arranged on the deflectable part of the diaphragm, i.e. the central region of the diaphragm 14. The edge fastening 16 may, for example, be obtained by the diaphragm 14 being clamped or held in the layer 62 or another layer on an edge of the diaphragm 14, for instance in order to allow the electrical contacting.

Figure 5:
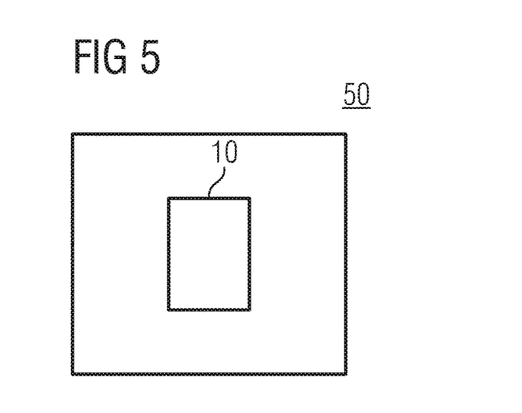
FIG. 5 shows a schematic block diagram of an MEMS microphone according to one exemplary embodiment.

FIG. 5 shows a schematic block diagram of an MEMS microphone 50, which comprises the MEMS sound transducer 10 and is configured in order to pick up the sound field and provide an electrical signal on the basis thereof. The MEMS microphone may be referred to as a microphone with a dual backplate and a clamped diaphragm.

Although the MEMS microphone 50 is described in such a way that the MEMS sound transducer 10 is arranged, the MEMS sound transducer 20 and/or 40 may also be arranged as an alternative or in addition.

The described exemplary embodiments reduce or eliminate the influence of external stresses on the performance of the system. The overall acoustic performance may therefore likewise be improved. One aspect is an MEMS microphone sensor having a dual backplate and a stress-free or stress-reduced diaphragm, which is clamped between the two backplates. This eliminates the negative effect of external stresses and increases the acoustic performance and the robustness in terms of particles and pressure moments. Silicon-based microphones can be produced in large production numbers. The described exemplary embodiments may have an influence on how new package concepts are developed, may have a high yield, i.e. low losses of yield and simple ASIC (Application specific integrated circuit). The system allows a high robustness, a high signal-to-noise ratio and further aspects.

The MEMS sound transducer 40, but also other described MEMS sound transducers, make it possible to obtain a diaphragm with low stress or even a stress-free diaphragm.

This makes it possible that the MEMS sound transducer can be formed in the absence of a calibration unit, for instance a calibration ASIC.

Although many aspects have been described in connection with a device, it is to be understood that these aspects also represent a description of the corresponding method, so that a block or component of a device is also to be understood as a corresponding method step or as a feature of a method step. In a similar way to this, aspects which have been described in connection with or as a method also represent a description of a corresponding block or detail or feature of a corresponding device.

The exemplary embodiments described above merely represent an illustration of the principles of the present concept. It is to be understood that modifications and variations of described arrangements and details are clear to the person skilled in the art. It is therefore intended that the concept be restricted only by the protective scope of the following patent claims, and not by the specific details which have been presented herein with the aid of the description and the explanation of the exemplary embodiments.

What is claimed is:

1. A MEMS sound transducer, comprising:
   a first and a second backplate;
   a diaphragm, which is arranged between the first and the second backplate and is held by an edge fastening between the first and the second backplate; and
   a clamping structure, which is configured to provide fixing for the diaphragm when an electrostatic force acting in an operating state is applied between the first and the second backplate, at a distance from the edge fastening, and to release the fixing in absence of the electrostatic force, wherein the clamping structure comprises two opposite clamping elements configured to clamp the diaphragm at a clamping position between the opposite clamping elements when the electrostatic force is applied between the first backplate and the second backplate in order to obtain the fixing of the diaphragm.

2. The MEMS sound transducer as claimed in claim 1, wherein the clamping structure is arranged laterally at the distance from the edge fastening, and is configured to provide the fixing laterally at the distance from the edge fastening and from a plane of the first backplate or the second backplate.

3. The MEMS sound transducer as claimed in claim 1, wherein the MEMS sound transducer is configured for an operating frequency range, and the diaphragm has a diaphragm tension required for the operating frequency range during the fixing.

4. The MEMS sound transducer as claimed in claim 1, wherein the MEMS sound transducer is configured to provide the fixing in a central region of the diaphragm.

5. The MEMS sound transducer as claimed in claim 1, wherein the diaphragm is configured to oscillate along an oscillation direction during operation of the MEMS sound transducer, and wherein the fixing causes a restriction of a freedom of movement of the diaphragm, at the distance from the edge fastening.

6. The MEMS sound transducer as claimed in claim 1, wherein at least a first clamping element of the two opposite clamping elements has a dimension of at least 1 µm and at most 40 µm along a thickness direction between the first backplate and the diaphragm.

7. The MEMS sound transducer as claimed in claim 1, wherein a first clamping element or a second clamping element of the two opposite clamping elements has a dimension of at least 1 µm and at most 40 µm along a direction parallel to a diaphragm plane.

8. The MEMS sound transducer as claimed in claim 1, wherein the two opposite clamping elements comprise a semiconductor material.

9. The MEMS sound transducer as claimed in claim 1, wherein the two opposite clamping elements are configured to be electrically insulating.

10. The MEMS sound transducer as claimed in claim 1, wherein a first clamping element of the two opposite clamping elements is connected firmly to the first backplate, and wherein a second clamping element of the two opposite clamping elements is connected firmly to the second backplate.

11. The MEMS sound transducer as claimed in claim 1, wherein the two opposite clamping elements form a first pair of opposite clamping elements, and wherein the clamping structure comprises at least a second pair of opposite clamping elements.

12. The MEMS sound transducer as claimed in claim 1, wherein the two opposite clamping elements are arranged in a central region of the diaphragm.

13. The MEMS sound transducer as claimed in claim 1, wherein at least one of the clamping elements is formed comprising an oxide material, a semiconductor material, a nitride material or carbon material.

14. The MEMS sound transducer as claimed in claim 1, wherein the first and the second backplate are configured to move toward one another when the electrostatic force is applied, the clamping structure being arranged between the first backplate and the second backplate, and the clamping structure being configured to provide the fixing by a movement of the first backplate and the second backplate.

15. The MEMS sound transducer as claimed in claim 14, wherein the clamping structure is configured to release the fixing by movement of the first and the second backplate away from one another.

16. The MEMS sound transducer as claimed in claim 1, wherein the diaphragm is connected at least locally by means of a spring element to a substrate of the MEMS sound transducer, wherein an oscillation property of the diaphragm is essentially uninfluenced by the spring element.

17. The MEMS sound transducer as claimed in claim 16, wherein the spring element is configured as a solid-state articulation.

18. The MEMS sound transducer as claimed in claim 16, wherein the spring element and the diaphragm are formed in one piece.

19. The MEMS sound transducer as claimed in claim 1, wherein the MEMS sound transducer is formed in the absence of a calibration unit.

20. The MEMS sound transducer as claimed in claim 1, wherein a first clamping element of two opposite clamping elements is part of the first backplate, and wherein a second clamping element of the two opposite clamping elements is part of the second backplate.

21. The MEMS sound transducer as claimed in claim 1, wherein a sensitivity of the diaphragm is dominated by a flexural stiffness of the diaphragm.

22. The MEMS sound transducer as claimed in claim 1, wherein the MEMS sound transducer is a MEMS microphone.

23. A method for providing a MEMS sound transducer, having the following steps:
   providing a first and a second backplate;

arranging a diaphragm between the first and the second backplate, so that it is held by an edge fastening between the first and the second backplate; and arranging a clamping structure so that it provides fixing for the diaphragm when an electrostatic force acting in an operating state is applied between the first and the second backplate and at a distance from the edge fastening, and to release the fixing in absence of the electrostatic force, wherein the clamping structure comprises two opposite clamping elements configured to clamp the diaphragm at a clamping position between the opposite clamping elements when the electrostatic force is applied between the first backplate and the second backplate in order to obtain the fixing of the diaphragm.

24. A MEMS sound transducer, comprising:

a first and a second backplate;

a diaphragm, which is arranged between the first and the second backplate and is held by an edge fastening between the first and the second backplate, wherein the diaphragm is connected at least locally by means of a spring element to a substrate of the MEMS sound transducer, wherein an oscillation property of the diaphragm is essentially uninfluenced by the spring element; and a clamping structure, which is configured to provide fixing for the diaphragm when an electrostatic force acting in an operating state is applied between the first and the second backplate, at a distance from the edge fastening, and to release the fixing in absence of the electrostatic force.

25. A method of using MEMS a sound transducer, comprising a first and a second backplate; a diaphragm, which is arranged between the first and the second backplate and is held by an edge fastening between the first and the second backplate; and a clamping structure, which is configured to provide fixing for the diaphragm when an electrostatic force acting in an operating state is applied between the first and the second backplate, at a distance from the edge fastening, and to release the fixing in absence of the electrostatic force, wherein the clamping structure comprises two opposite clamping elements, the method comprising:

clamping the diaphragm at a clamping position between the opposite clamping elements by applying the electrostatic force between the first backplate and the second backplate in order to obtain the fixing of the diaphragm.

26. The method of claim 25, further comprising releasing the fixing of the diaphragm by removing the electrostatic force between the first and the second backplate.

27. The method of claim 25, further comprising transducing a sound using the MEMS sound transducer.

* * * * *